United States Patent [19]

Nishitani et al.

[11] Patent Number: 5,392,235
[45] Date of Patent: Feb. 21, 1995

[54] SEMICONDUCTOR MEMORY DEVICE

[75] Inventors: Kazuharu Nishitani; Masao Takiguchi, both of Itami, Japan

[73] Assignee: Mitsubishi Denki Kabushiki Kaisha, Tokyo, Japan

[21] Appl. No.: 63,428

[22] Filed: May 19, 1993

[30] Foreign Application Priority Data

May 26, 1992 [JP] Japan .................. 4-160132

[51] Int. Cl.$^6$ .............................................. G11C 11/00
[52] U.S. Cl. ...................................... 365/154; 365/190
[58] Field of Search ........... 365/154, 156, 190, 189.01, 365/181, 233

[56] References Cited

U.S. PATENT DOCUMENTS

| | | | |
|---|---|---|---|
| 4,132,904 | 1/1979 | Harari | 365/154 |
| 4,149,268 | 4/1979 | Waters | 365/156 |
| 4,287,574 | 9/1981 | Ushida | 365/156 |
| 5,047,979 | 9/1991 | Leung | 365/154 |
| 5,157,625 | 10/1992 | Barry | 365/154 |

FOREIGN PATENT DOCUMENTS 315278 2/1991 Japan .

*Primary Examiner*—Eugene R. LaRoche
*Assistant Examiner*—A. Zarabian
*Attorney, Agent, or Firm*—Leydig, Voit & Mayer

[57] ABSTRACT

A semiconductor memory device includes a data line for receiving a voltage and an inverted data line having a voltage inverted relative to the voltage received by the data line; a first transistor and a second transistor for selecting a memory element for writing in data and reading out data through the data line and the inverted data line, respectively; two inverters, each inverter including a first p channel transistor and a first n channel transistor with the input and the output of the one inverter respectively connected to the output and the input of the other inverter and between either the source and the drain of the first transistor or the drain and the source of the second transistor; and a second p channel transistor connected in series to the first p channel transistor of one of the two inverters. When the same data, "0" or "1", is to be written into all memory elements, the second p channel transistor is turned off to inhibit "H" driving of the inverters and no "H" driven output of the inverter collides with the output of an "L" driven writing driver. As a result, writing of the same data into all memory elements can be performed without malfunction.

5 Claims, 9 Drawing Sheets

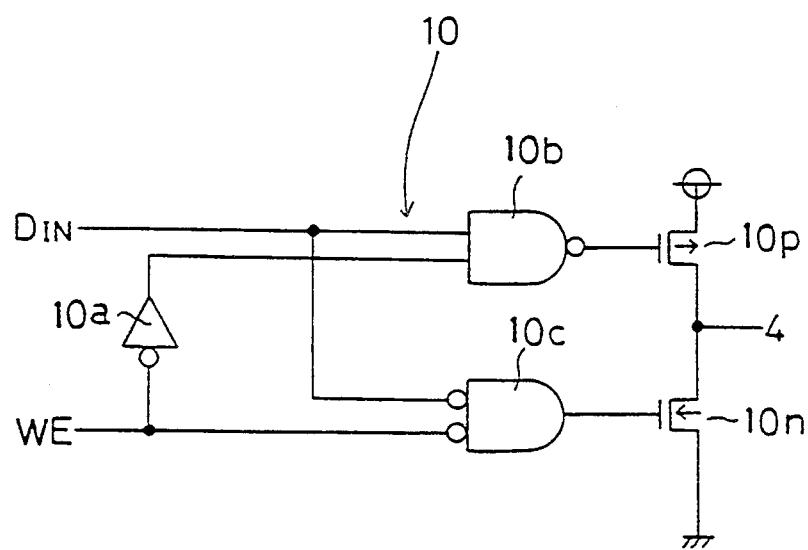
Fig.9 (a) PRIOR ART
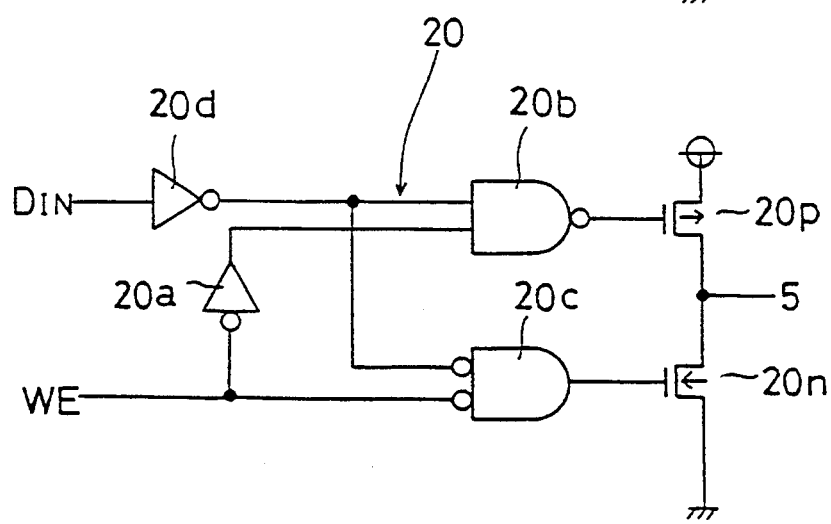
Fig.9 (b) PRIOR ART

5,392,235

SEMICONDUCTOR MEMORY DEVICE

FIELD OF THE INVENTION

The present invention relates to a semiconductor memory device and, more particularly, to a circuit construction including an arrangement of memory elements for constituting a memory device.

BACKGROUND OF THE INVENTION

FIG. 8 is a diagram illustrating circuit construction of a prior art semiconductor memory device. In the figure, reference numeral 1 designates an address decoder. Reference numerals A0 to A31 designate address lines that are output lines of the address decoder 1 for selecting memory elements. Reference numeral 2 designates data input $D_{IN}$, numeral 3 designates data output $D_{OUT}$, numeral 4 designates a data line, and numeral 5 designates an inverted data line. Each block 8, comprising n channel transistors 6 and 7 for selecting a memory element indicated by an address line, an inverter 11 comprising a p channel transistor 21 and an n channel transistor 31, and an inverter 12 comprising a p channel transistor 22 and an n channel transistor 32, is connected to one of address lines A0 to A31, respectively. Reference numeral 9 designates a writing enable signal for indicating writing in or reading out of data to or from memory elements. Reference numerals 10 and 20 designate drivers for writing in, which drive a data line 4 and an inverted data line 5, respectively. Reference numeral 30(C) designates a signal for initializing all memory elements, that is, a signal for writing data "0" in all memory elements.

FIGS. 9(a) and 9(b) are diagrams illustrating circuit constructions of the driver 10 for writing in data into a data line and the driver 20 for writing in data into an inverted data line, respectively. In FIG. 9(a), reference numeral 10a designates an inverter, numeral 10b designates a two-input NAND gate, numeral 10c designates a two-input NOR gate, numeral 10p designates a p channel transistor, and numeral 10n designates an n channel transistor. In FIG. 9(b), reference numerals 20a and 20d designate inverters, numeral 20b designates a two-input NAND gate, numeral 20c designates a two-input NOR gate, numeral 20p designates a p channel transistor, and numeral 20n designates an n channel transistor.

A description is given of the operation during writing in of the prior art semiconductor memory device.

During writing in, since the signal 9(WE) is "L", data input $D_{IN}$ and data input obtained from the data input $D_{IN}$ and inverted by the inverter 20d are applied to a data line 4 and an inverted data line 5 by writing drivers 10 and 20, respectively. Then, one of address lines A0 to A31, for example A0, is set "H" by an address decoder 1, and thereby the data $D_{IN}$ is written in into a selected memory element. At this time, a signal 30(C) is "L". Here, when data $D_{IN}$ is "L", "0" is written in memory elements while when the data $D_{IN}$ is "H", "1" is written in.

The operation at the initialization of memory elements is described. When a signal 30(C) is set "H", all address lines A0 to A31 are set "H", and the data input $D_{IN}$ is set "L", data "0" can be written in all memory elements. Then, an n channel transistor 10n of the writing driver 10 drives inputs of inverters 11, which are included in all thirty-two memory elements selected by the address lines A0 to A31, to "L" via a data line 4. A p channel transistor 20p of a writing driver 20 drives inputs of inverters 12, which are included in all thirty-two memory elements selected by the address lines A0 to A31, to "H" via an inverted data line 5.

When all memory elements are in states having data opposite to the initializing data, for example, when data "0" is to be input to all memory elements in state of data "1", the n channel transistor 10n of the driver 10 is required to reduce input voltages of inverters 11 of all memory elements to a value lower than the transition voltages of the inverters 11, overcoming drain voltages of the p channel transistors 22 (a parallel connection of thirty-two elements), one end of each of which is connected to power supply voltages.

Similarly, in all memory elements, the p channel transistor 20p of the driver 20 is required to increase input voltages of the inverters 12 to a value higher than the transition voltage of the inverters 12, overcoming drain voltages of the n channel transistors 31 (a parallel connection of thirty-two elements), one end of each of which is grounded.

Since the prior art semiconductor memory device is constructed as described above, when all memory elements are initialized, if a writing driver has a small driving ability, all memory elements cannot be initialized at the same time, i.e., writing in of the same data into all memory elements cannot be performed at the same time. Therefore, the size of the transistor of the writing driver must be increased in accordance with a total word line number, i.e., address line number, in order that writing in of the same data into all memory elements can be performed at the same time.

SUMMARY OF THE INVENTION

An object of the present invention is to provide a semiconductor memory device in which writing in of the same data into all memory elements is reliably performed at the same time, i.e., all memory elements are initialized at the same time, independent of the number of word lines constituting a RAM.

Other objects and advantages of the present invention will become apparent from the detailed description given hereinafter; it should be understood, however, that the detailed description and specific embodiment are given by way of illustration only, since various changes and modifications within the spirit and the scope of the invention will become apparent to those skilled in the art from this detailed description.

According to a first aspect of the present invention, in a semiconductor memory device, one of the two inverters provided in each memory element includes, in addition to first p channel and n channel transistors, a second p channel transistor connected in series with the first p channel transistor. When the same data, "0" or "1", is to be written in all the memory elements, the additionally connected second p channel transistor is turned off to inhibit "H" driving of the inverter, and no "H" driven output of the inverter collides with the output of an "L" driven writing driver. As a result, writing in of the same data into all the memory elements is performed without malfunction.

According to a second aspect of the present invention, in a semiconductor memory device, each of the two inverters in each memory element includes, in addition to first p channel and n channel transistors, a second p channel transistor connected in series with the first p channel transistor. When the same data, "0" or "1", is to be written in every memory element, either of the two additionally connected second p channel transistors is turned off to inhibit "H" driving of the inverter, and no "H" driven output of the inverter collides with the output of an "L" driven writing driver. As a result, writing of the same data into all the memory elements is performed without malfunction.

According to a third aspect of the present invention, in a semiconductor memory device, one of the two inverters provided in each memory element includes, in addition to first p channel and n channel transistors, a second n channel transistor connected in series with the first n channel transistor When the same data, "0" or "1", is to be written in all the memory elements, the additionally connected second n channel transistor is turned off to inhibit "L" driving of the inverter, and no "L" driven output of the inverter collides with the output of an "H" driven writing driver. As a result, writing in of the same data into all the memory elements is performed without malfunction.

According to a fourth aspect of the present invention, in a semiconductor memory device, each of the two inverters provided in each memory element includes, addition to a first p channel and n channel transistors, a second n channel transistor connected in series with the first n channel transistor. When the same data, "0" or "1", is to be written in all the memory elements, one of the two additionally connected second n channel transistors is turned off to inhibit "L" driving of the inverter, and no "L" driven output of the inverter collides with the output of an "H" driven writing driver. As a result, writing of the same data into all the memory elements is performed without occurring malfunction.

According to a fifth aspect of the present invention, in a semiconductor memory device, one of the two inverters provided in each memory element includes, in addition to first p channel and n channel transistor, a second p channel transistor connected in series with the first p channel transistor and a second n channel transistor connected in series with the first n channel transistor. When the same data, "0" or "1", is to be written in all the memory elements, either of the additionally connected second p channel transistor and the additionally connected second n channel transistor is turned off to inhibit "H" or "L" driven of the inverter, and no "H" or "L" driven output of the inverter collides with the output of an "H" or "L" driving writing driver. As a result, writing of the same data into all the memory elements is performed without occurring malfunction.

BRIEF DESCRIPTION OF THE DRAWINGS

FIG. 9 (a–b) is a diagram illustrating a circuit construction of a writing driver.

DETAILED DESCRIPTION OF THE PREFERRED EMBODIMENTS

Embodiment 1

Figure 1:
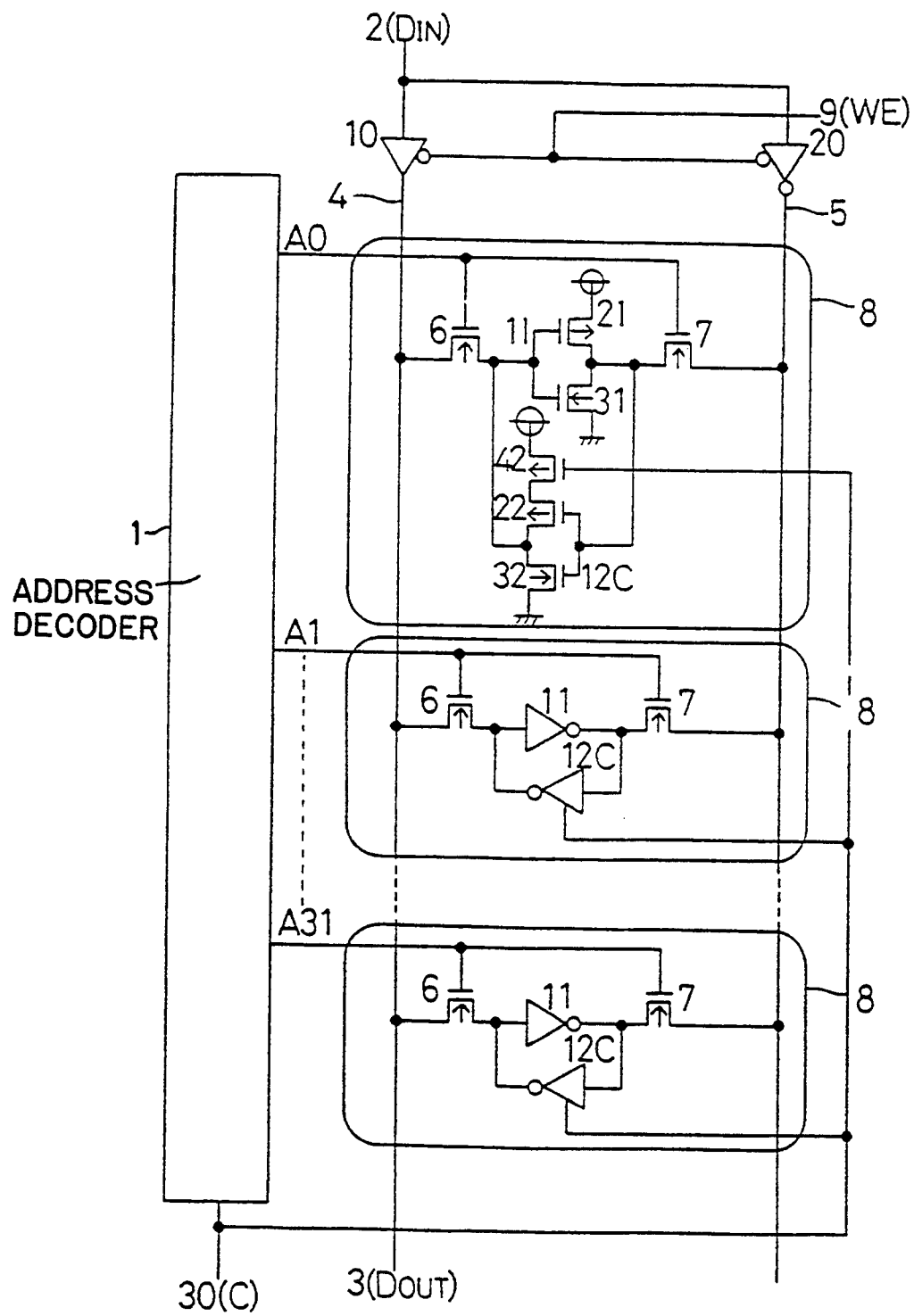
FIG. 1 is a diagram illustrating a circuit construction of a semiconductor memory device in accordance with a first embodiment of the present invention.
Figure 8:
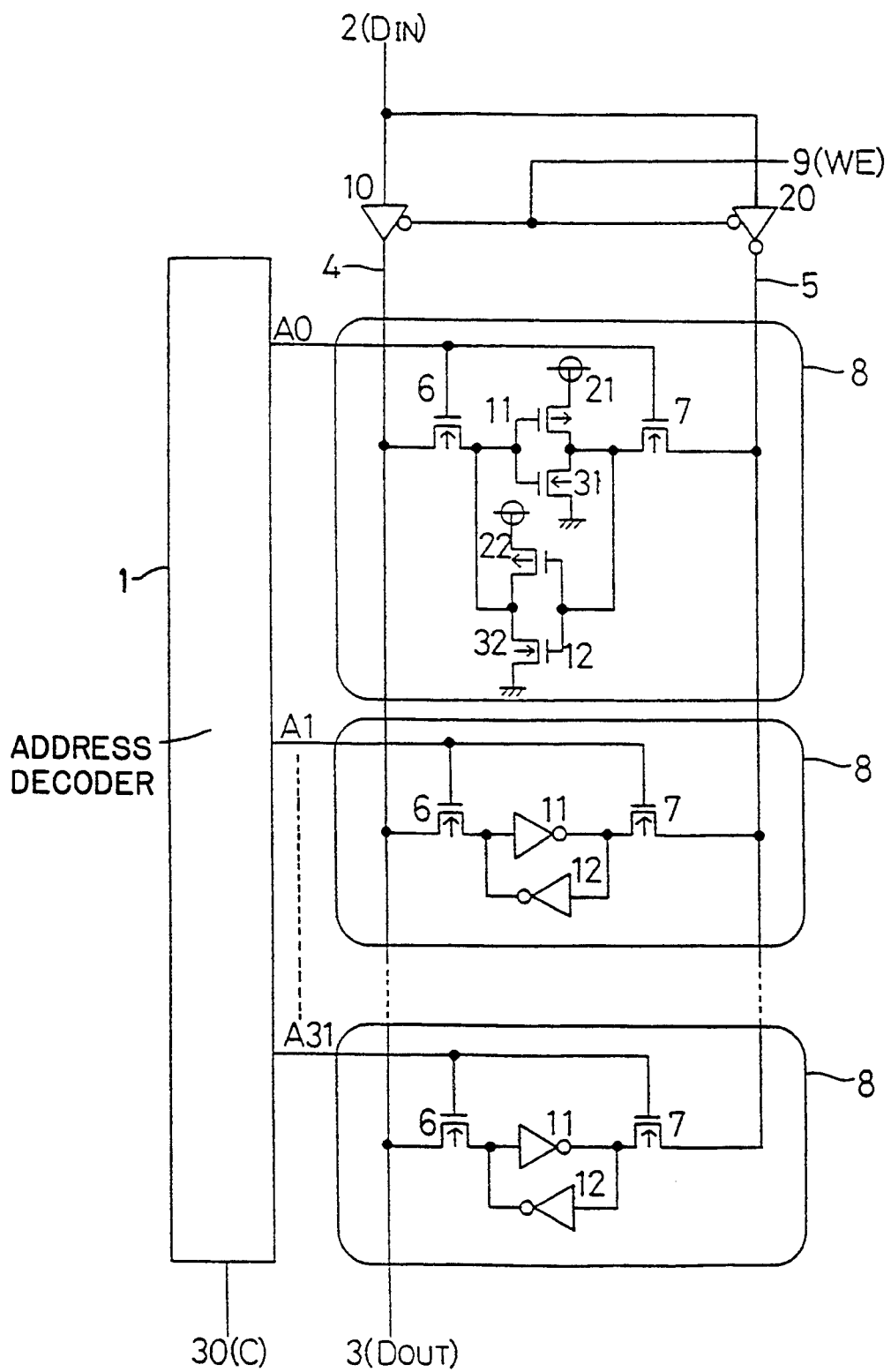
FIG. 8 is a diagram illustrating a circuit construction of a prior art semiconductor memory device.

A description is given of a first embodiment of the present invention with reference to FIG. 1. FIG. 1 is a diagram illustrating a circuit construction of a semiconductor memory device in accordance with a first embodiment of the present invention. In FIG. 1, an address decoder 1 is designed to output signals for selecting memory elements through address lines A0 to A31. Reference numeral 2 designates a data input $D_{IN}$, numeral 4 designates a data line, numeral 5 designates an inverted data line to which inverted data of the data $D_{IN}$ is applied, and numeral 3 designates a data output $D_{OUT}$ of the data line 4. An inverter 11, comprising p channel transistor 21 and an n channel transistor 31, is connected between n channel transistors 6 and 7 which function to select memory elements indicated by the address lines. Reference numeral 12C designates an inverter with control function according to the present invention, comprising a p channel transistor 22 and an n channel transistor 32, and an additionally connected p channel transistor 42. This second p channel transistor 42 is connected between the first p channel transistor 22 of the inverter 12 of the prior art device of FIG. 8 and the first power supply, and a gate input of the p channel transistor 42 is connected to a signal 30(C). Each block 8 comprising the n channel transistors 6 and 7, the inverter 11, and the control function appended inverter 12C is connected to one of the address lines A0 to A31. Reference numeral 9 designates a signal WE for controlling writing data in and reading data out of memory elements. Writing drivers 10 and 20 are designed to drive a data line 4 and an inverted data line 5, respectively. Reference numeral 30 designates a signal C for initializing all memory elements, i.e., writing data "0" into all memory elements. The writing drivers 10 and 20 have the same constructions as those shown in FIG. 9.

First, a description is given of the usual writing in operation where a signal 30 is set "L". As in the prior art device, when a signal WE is "L", the data $D_{IN}$ and the inverted data of the data $D_{IN}$ are applied to the data line 5 and the inverted data line 5 by the writing drivers 10 and 20, respectively. Then, one of the address lines A0 to A31, for example A0, becomes "H" in response to the address decoder 1, and the data $D_{IN}$ is written in the selected memory element. Here, when the data $D_{IN}$ is "L", "0" is written in the memory element while when the data $D_{IN}$ is "H", "1" is written in.

Second, a description is given of the operation at the initialization of all memory elements. Here, all memory elements are initialized to "0". When the signal 30(C) is set "H", all address lines A0 to A31 are set "H", and a data input $D_{IN}$ is set "L", an "L" voltage and an "H" voltage are applied via a data line 4 and an inverted data line 5, respectively, to all memory elements. Then, since the signal 30 is set "H", the additionally connected second p channel transistor 42 in each memory element is turned off to cut the "H" driving path for driving the inverter 12C from the power supply through the p channel transistor 22. Therefore, the writing driver 10 easily reduces the input voltage of the inverter 11 to a value lower than the transition voltage of the inverter 11 even when the data held in this memory element before the initialization is "1". As a result, the output voltage of the inverter 11 becomes "H", which is equal to an output voltage of the writing driver 20. In this way, "0" data can be written into all memory elements, even if each memory element contains data "1" before being initialized.

Embodiment 2

Figure 2:
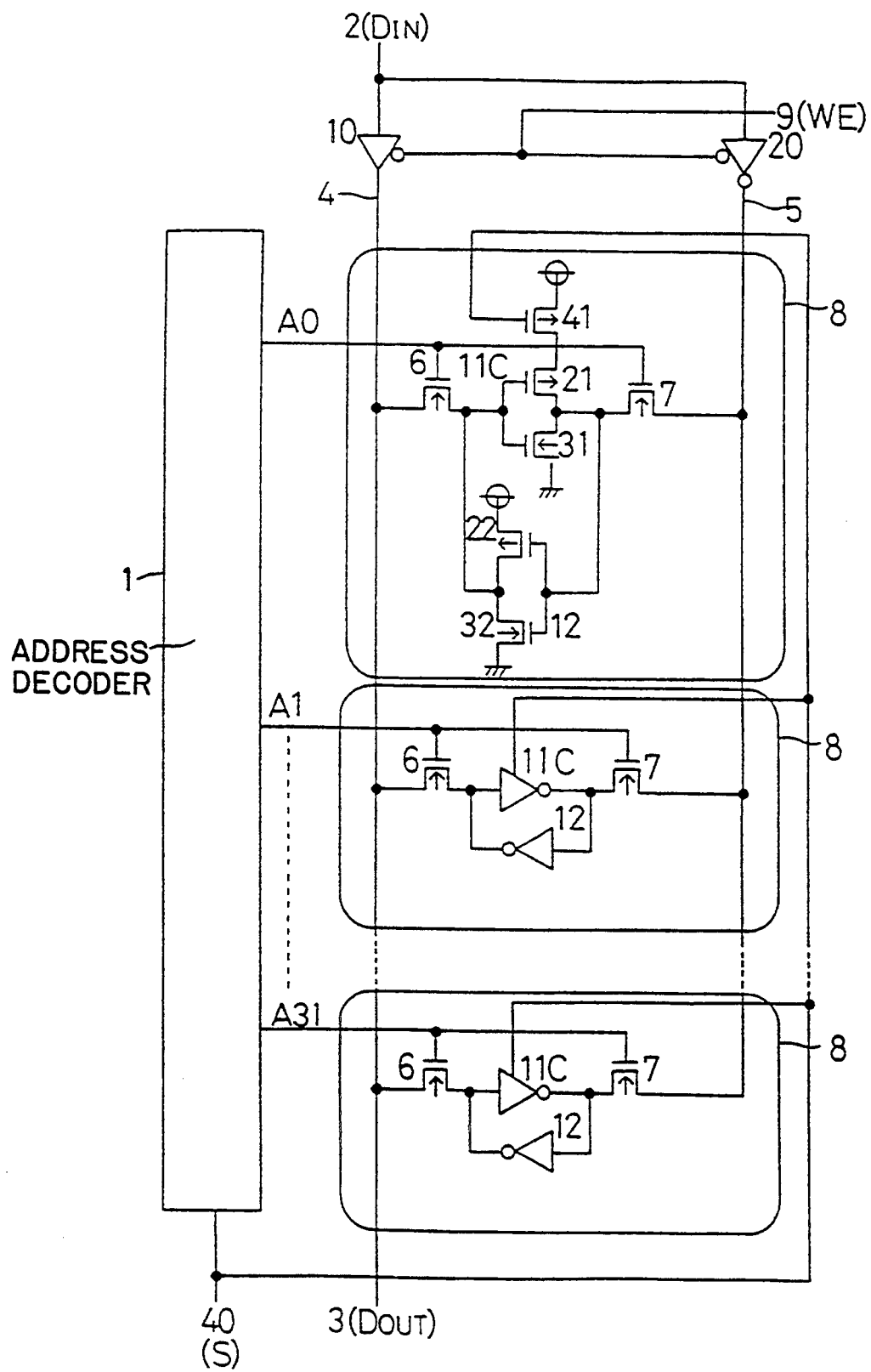
FIG. 2 is a diagram illustrating a circuit construction of a semiconductor memory device in accordance with a second embodiment of the present invention.

A description is given of a second embodiment of the present invention with reference to FIG. 2. In FIG. 2, the same reference numerals as those in FIG. 1 designate the same or corresponding elements. An inverter 12 comprises a p channel transistor 22 and an n channel transistor 32. A control function appended inverter 11C of this second embodiment comprises a p channel transistor 21 and an n channel transistor 31, and an additionally connected p channel transistor 41. The additionally connected second p channel transistor 41 is connected between the first p channel transistor 21 and the first power supply. A gate input of the transistor 41 is connected to a signal 40(S) for the initialization of all memory elements, i.e., writing "1" into all memory elements. Each block 8, comprising the n channel transistors 6 and 7, and the control function appended inverter 11C and the inverter 12, is connected to one of address lines A0 to A31.

First, a description is given of the usual writing in operation where a signal 40 is set "L". As in the prior art device, when a signal WE is "L", the data $D_{IN}$ and the inverted data of the data $D_{IN}$ are applied to the data line 4 and the inverted data line 5 by the writing drivers 10 and 20, respectively. Then, one of the address lines A0 to A31, for example A0, becomes "H" in response to the address decoder 1, and the data $D_{IN}$ is written in the selected memory element. Here, when the data $D_{IN}$ is "L", "0" is written into the memory element while when the data $D_{IN}$ is "H", "1" is written in.

Second, a description is given of the operation at the initialization of all memory elements. Here, all memory elements are initialized to "1". When the signal 40(S) is set "H", all address lines A0 to A31 are set "H", and the data input $D_{IN}$ is set "H", an "H" voltage and an "L" voltage are respectively applied to all memory elements through the data line 4 and the inverted data line 5. At this time, since the signal 40 is set "H", the second p channel transistor 41 is turned off to cut the "H" driving path for driving the control function appended inverters 11C from the power supply through the p channel transistor 21. Therefore, even when the data held in the memory element before the initialization is "0", the writing driver 20 easily reduces the input voltage of the inverter 12 to a value lower than the transition voltage of the inverter 12. As a result, the output voltage of the inverter 12 becomes "H", which is equal to an output voltage of the writing driver 10. In this way, "1" can be written in all memory elements, even if each memory element contains data "0" before being initialized.

Embodiment 3

Figure 3:
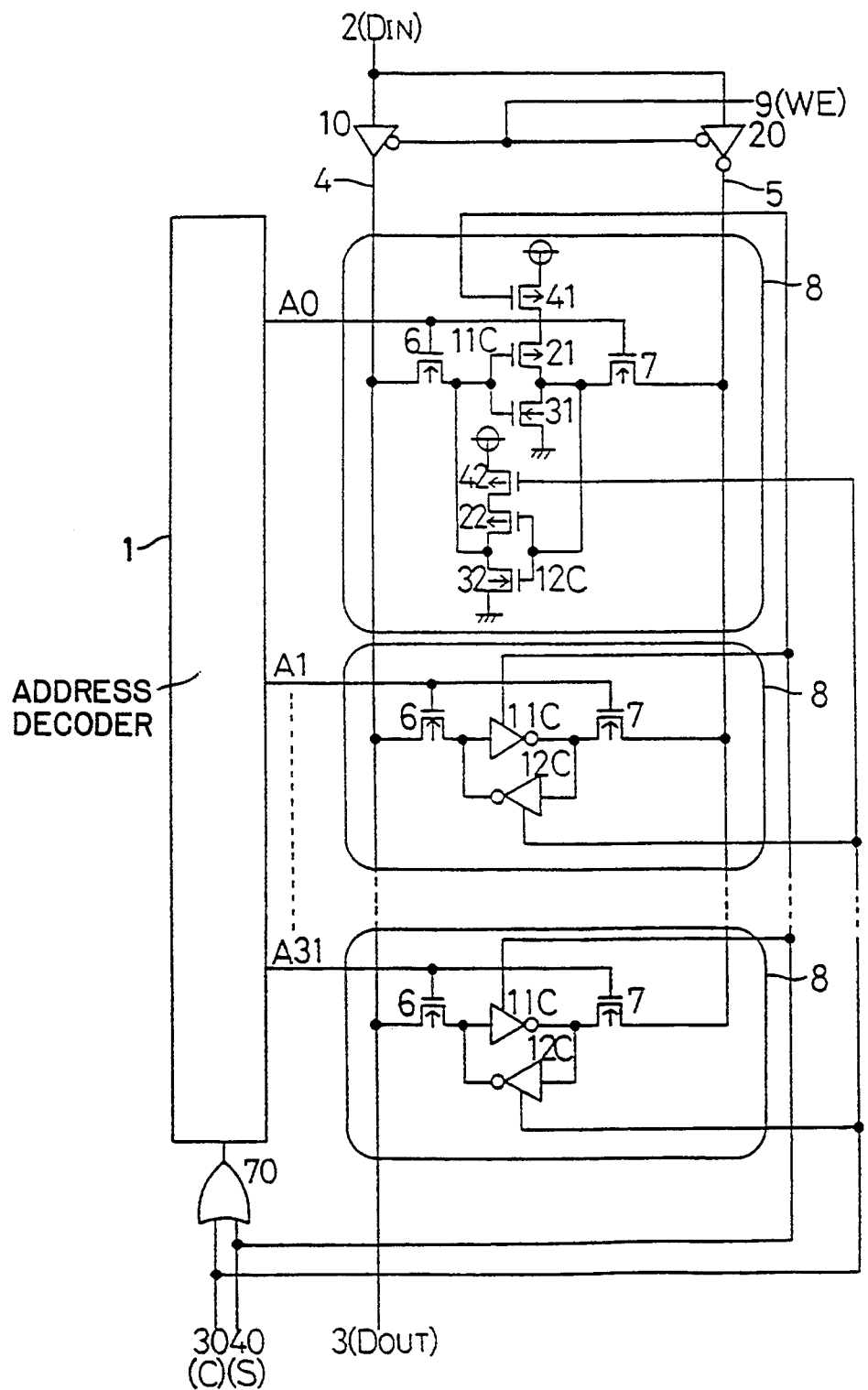
FIG. 3 is a diagram illustrating a circuit construction of a semiconductor memory device in accordance with a third embodiment of the present invention.

A description is given of a third embodiment of the present invention with reference to FIG. 3. In FIG. 3, the same reference numerals as those in FIGS. 1 and 2 designate the same or corresponding elements. A control function appended inverter 11C comprises a first p channel transistor 21 and a first n channel transistor 31, and an additionally connected second p channel transistor 41. The additionally connected second p channel transistor 41 having a gate input connected to the signal 40, is connected between the first p channel transistor 21 and the first power supply. Also a control function inverter 12C comprises a first p channel transistor 22 and a first n channel transistor 32, and an additionally connected second p channel transistor 42. The additionally connected second p channel transistor 42, having a gate input connected to the signal 30, is connected between the first p channel transistor 22 and the first power supply. Each block 8, comprising the n channel transistors 6 and 7 and the control function appended inverters 11C and 12C, is connected to one of address lines A0 to A31. Reference numeral 70 designates an OR circuit.

First, a description is given of the usual writing in operation where the signals 30 and 40 are both "L". As in the prior art, when the signal 9(WE) is "L", the data $D_{IN}$ and the inverted data of the data $D_{IN}$ are applied to the data line 4 and the inverted data line 5 by the writing drivers 10 and 20, respectively. Then, one of the address lines A0 to A31, for example A0, becomes "H" in response to the address decoder 1, and the data $D_{IN}$ is written in the selected memory element. Here, when data $D_{IN}$ is "L", "0" is written in the memory element while when the data $D_{IN}$ is "H", "1" is written in.

Second, a description is given of the operation at initializing all memory elements to "0". When the signals 30(C) and 40(S) are respectively set "H" and "L", all address lines A0 to A31 are set "H", and the data input $D_{IN}$ is set "L", an "L" voltage and an "H" voltage are applied to all memory elements through the data line 4 and the inverted data line 5, respectively. At this time, since the signal 30 is set "H", the additionally connected second p channel transistor 42 is turned off to cut the "H" driving path for "H" driving the control function appended inverter 12C from the power supply through the p channel transistor 22. Therefore, the writing driver 10 easily reduces the input voltage of the control function appended inverters 11C to a value lower than the transition voltage of the control function appended inverter 11C even when the data held in this memory element before the initialization is "1", and the output voltage of the inverter 11C becomes "H", which is equal to an output voltage of the writing driver 20. In this way, data "0" can be written in all memory elements, even if memory elements contain "1" before being initialized.

Third, the operation of initializing all memory elements to "1" is described. When signals 30(C) and 40(S) are respectively set "L" and "H", all address lines A0 to A31 are set "H", and the data input $D_{IN}$ is set "H", an "H" voltage and an "L" voltage are applied to all memory elements through the data line 4 and the inverted data line 5, respectively. At this time, since the signal 40 is set "H", the second p channel transistor 41 is turned off to cut the "H" driving path for "H" driving the control function appended inverters 11C from the power supply through the p channel transistor 21. Therefore, the writing driver 20 reduces the input voltage of the control function appended inverter 12C to a value lower than the transition voltage of the control function appended inverter 12C even when the data held before the initialization is "0", and the output voltage of the inverter 12C becomes "H", which is equal to an output voltage of the writing driver 10. In this way, "1" can be written in into all memory elements, even if each memory element contains "0" before being initialized.

Embodiment 4

Figure 4:
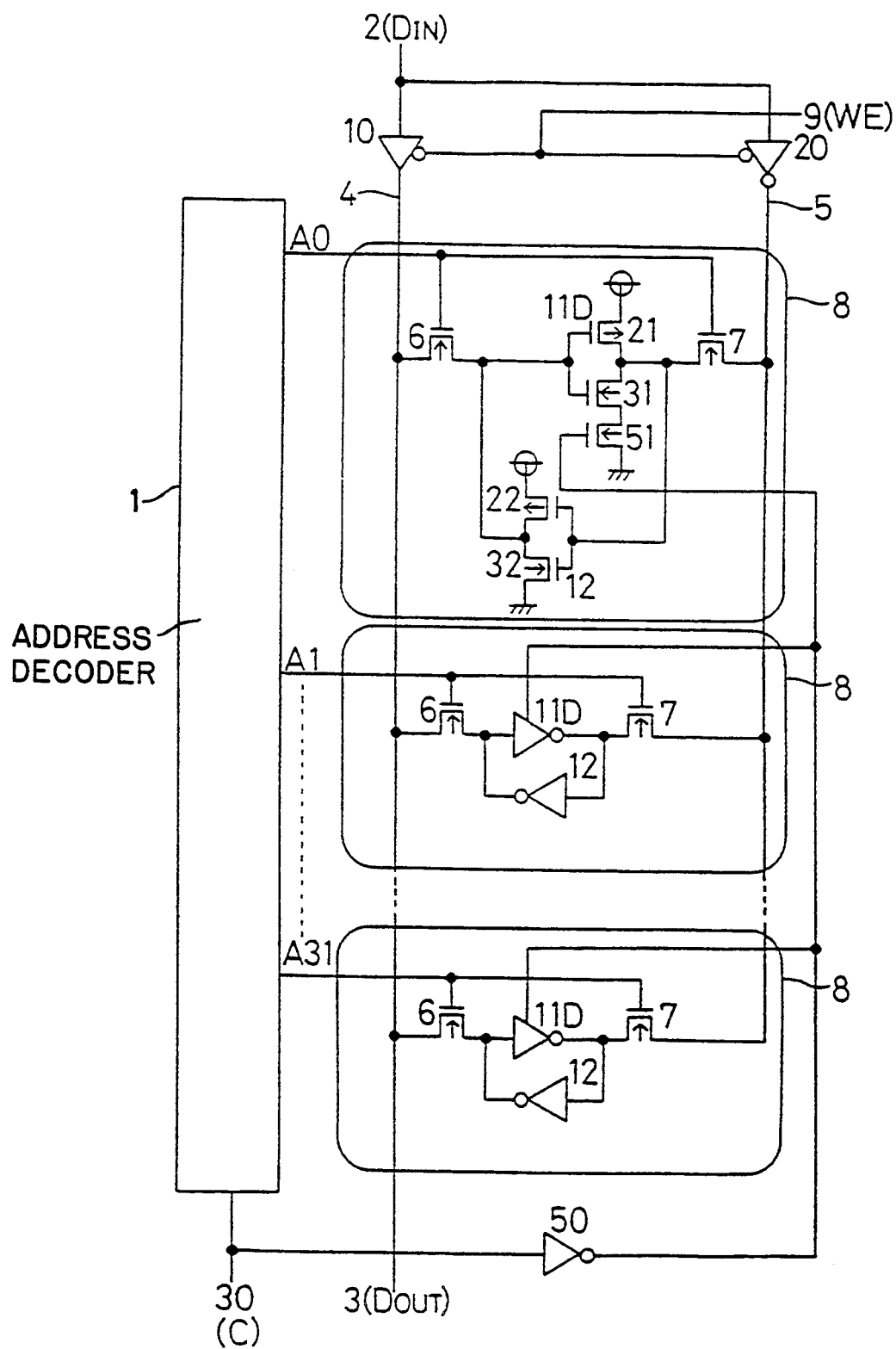
FIG. 4 is a diagram illustrating a circuit construction of a semiconductor memory device in accordance with a fourth embodiment of the present invention.

A description is given of a fourth embodiment of the present invention with reference to FIG. 4. In FIG. 4, the same reference numerals as those in FIGS. 1 to 3 designate the same or corresponding elements. A control function appended inverter 11D comprises a p channel transistor 21 and an n channel transistor 31, and an additionally connected n channel transistor 51. The additionally connected channel transistor 51, having a gate input connected to the signal 30(C) via an inverter 50, is connected between the n channel transistor 31 and the ground as a second power supply. Each block 8, comprising n channel transistors 6 and 7, the control function appended inverter 11D, and the inverter 12, is connected to one of address lines A0 to A31.

First, a description is given of the usual writing in operation where the signal 30(C) is set "L". As in the prior art device, at the usual writing in operation, when the signal WE is "L", the data $D_{IN}$ and the inverted data are applied to the data line 4 and the inverted data line 5 by the writing drivers 10 and 20, respectively. Then, one of the address lines A0 to A31, for example A0, becomes "H" in response to the address decoder 1, and the data $D_{IN}$ is written in the selected memory element. Here, when the data $D_{IN}$ is "L", "0" is written in memory elements while when the data $D_{IN}$ is "H", "1" is written in.

Second, a description is given of the operation at the initialization of all memory elements. Here, all memory elements are initialized to "0". When the signal 30(C) is set "H", all address lines A0 to A31 are set "H", and the data input $D_{IN}$ is set "L", an "L" voltage and an "H" voltage are applied to all memory elements through the data line 4 and the inverted data line 5, respectively. Then, since the signal 30 is set "H", the second n channel transistor 51 is turned off to cut the driving path for "L" driving the control function appended inverter 11D from the ground through the n channel transistor 31. The writing driver 20 easily increases the input voltage of the inverters 12 to a value higher than the transition voltage of the inverter 12 even when the data held in the memory element before the initialization is "1", and the output voltage of the inverter 12 becomes "L", which is equal to an output voltage of the writing driver 10. Thus, "0" can be written in all memory elements, even if each memory element contains "1" before being initialized.

Embodiment 5

Figure 5:
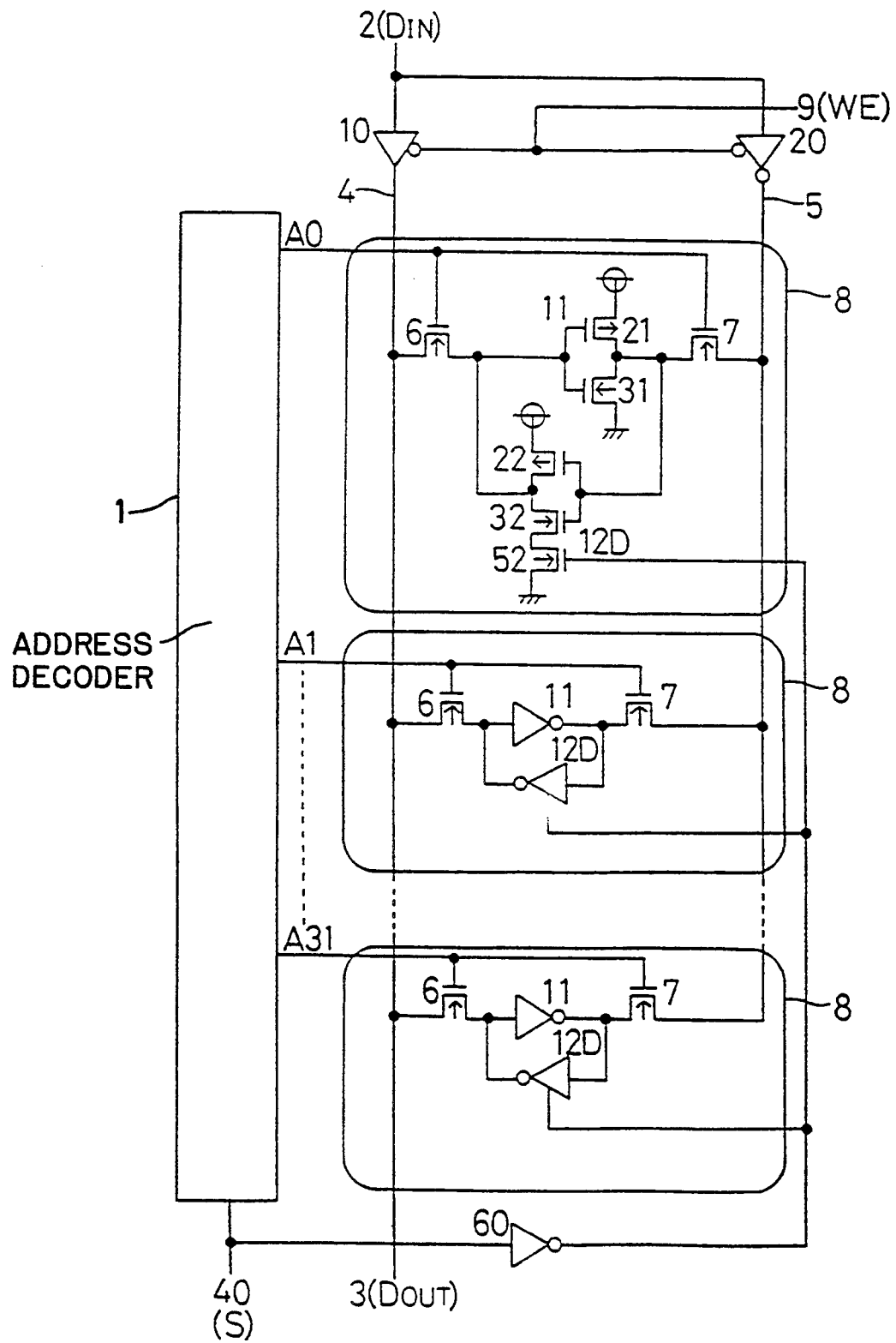
FIG. 5 is a diagram illustrating a circuit construction of a semiconductor memory device in accordance with a fifth embodiment of the present invention.

A description is given of a fifth embodiment of the present invention with reference to FIG. 5. In FIG. 5, the same reference numerals as those in FIGS. 1 to 4 designate the same or corresponding elements. A control function appended inverter 12D comprises a p channel transistor 22 and an n channel transistor 32, and an additionally connected n channel transistor 52. The additionally connected n channel transistor 52, having a gate input is connected to a signal 40 via an inverter 60, is connected between the n channel transistor 32 of the inverter 12 of the prior art device and the ground as a second power supply. Each block 8, comprising n channel transistors 6 and 7, the inverter 11, and the control function appended inverter 12D, is connected to one of address lines A0 to A31.

First, a description is given of the usual writing in operation in which the signal 40 is "L". As in the prior art device, when the signal WE is "L", the data $D_{IN}$ and the inverted data of the data $D_{IN}$ are applied to the data line 4 and the inverted data line 5 by the writing drivers 10 and 20, respectively. Then, one of the address lines A0 to A31, for example A0, becomes "H" in response to the address decoder 1, and the data $D_{IN}$ is written in the selected memory element. Here, when the data $D_{IN}$ is "L", "0" is written in the memory element while when the data $D_{IN}$ is "H", "1" is written in.

Second, the operation at the initialization of all memory elements will be described. Here, all memory elements are to be initialized to "1". When the signal 40(S), each of address lines A0 to A31, and a data input $D_{IN}$ are all set "H", an "H" voltage and an "L" voltage are supplied to all memory elements through a data line 4 and an inverted data line 5, respectively. At this time, since the signal 40 is set "H", the second n channel transistor 52 is turned off to cut "L" driving path for driving the control function appended inverter 12D from the ground through the first n channel transistor 32. Then, the writing driver 10 easily increases the input voltage of the inverter 11 to a value higher than the transition voltage of the inverter 11 even when the data held in this memory element is "0" before the initialization, and the output voltage of the inverter 11 becomes "L", which is equal to an output voltage of the writing driver 20. In this way, "1" can be written in all memory elements, even if each memory element contains "0" before being initialized.

Embodiment 6

Figure 6:
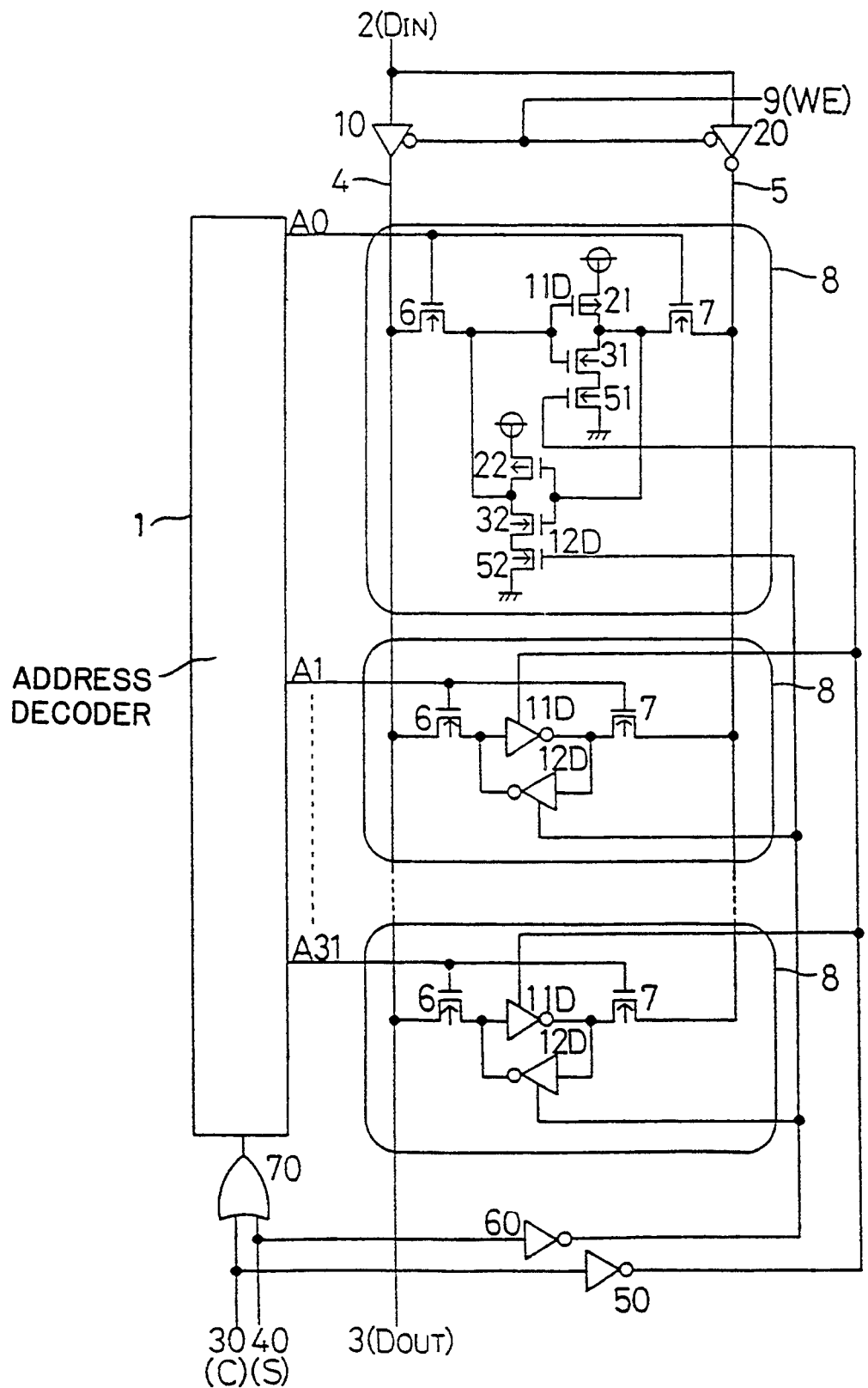
FIG. 6 is a diagram illustrating a circuit construction of a semiconductor memory device in accordance with a sixth embodiment of the present invention.

A description is given of a sixth embodiment of the present invention with reference to FIG. 6. In FIG. 6, the same reference numerals as those in FIGS. 1 to 5 designate the same or corresponding elements. A control function appended inverter 11D comprises a p channel transistor 21 and an n channel transistor 31, and an additionally connected n channel transistor 51. The additionally connected n channel transistor 51, having a gate input is connected to a signal 30 via an inverter 50, connected between the n channel transistor 31 and the ground as a second power supply. Each block 8, comprising the n channel transistors 6 and 7 and the control function appended inverters 11D and 12D, is connected to one of address lines A0 to A31.

First, the usual writing in operation, where signals 30 and 40 are both "L", is described. As in the prior art device, at the usual writing in operation, the signal WE is "L", and the data input $D_{IN}$ and the inverted data of the data $D_{IN}$ are applied to a data line 4 and an inverted data line 5, respectively. Then, one of the address lines A0 to A31, for example A0, becomes "H" in response to by the address decoder 1, and the data $D_{IN}$ is written in the selected memory element. Here, when the data $D_{IN}$ is "L", "0" is written in the memory element while when the data $D_{IN}$ is "H", "1" is to be written in Second, the operation at initializing all memory elements to "0" is described. When the signals 30(C) and 40(S) are set "H" and "L", respectively, all address lines A0 to A31 are set "H", and the data input $D_{IN}$ is set "L", an "L" voltage and an "H" voltage are applied to all memory elements through the data line 4 and the inverted data line 5, respectively. At this time, since the signal 30 is set "H", the n channel transistor 51 is turned off to cut the "L" driving path for "L" driving the control function appended inverter 11D from the ground through the n channel transistor 31. Then, the writing driver 20 easily increases the input voltage of the control function appended inverter 12D to a value higher than the transition voltage of the control function appended inverter 12D even when the data held in this memory element before the initialization is "1", and the output voltage of the inverter 12D becomes "L", which is equal to an output voltage of the writing driver 10. Therefore, "0" can be written in into all memory elements, even if each memory element contains "1" before being initialized.

Third, the operation at initializing all memory elements to "1" is described. When the signals 30(C) and 40(S) are set "L" and "H", respectively, all address lines A0 to A31 are set "H", and the data input $D_{IN}$ is set "H", an "H" voltage and an "L" voltage are applied to all memory elements through the data line 4 and the inverted data line 5, respectively. At this time, since the signal 40 is set "H", the second n channel transistor 52 is turned off to cut the "L" driving path for "L" driving the control function appended inverter 12D from the ground through the n channel transistor 32. Therefore, the writing driver 10 easily increases the input voltage of the control function appended inverter 11D to a value higher than the transition voltage of the control function appended inverter 11D even when the data held in this memory element before initialization is "0", and the output voltage of the control function appended inverter 11D becomes "L", which is equal to an output voltage of the writing driver 20. In this way, "1" can be written in all memory elements, even if each memory element contains "0" before being initialized.

Embodiment 7

Figure 7:
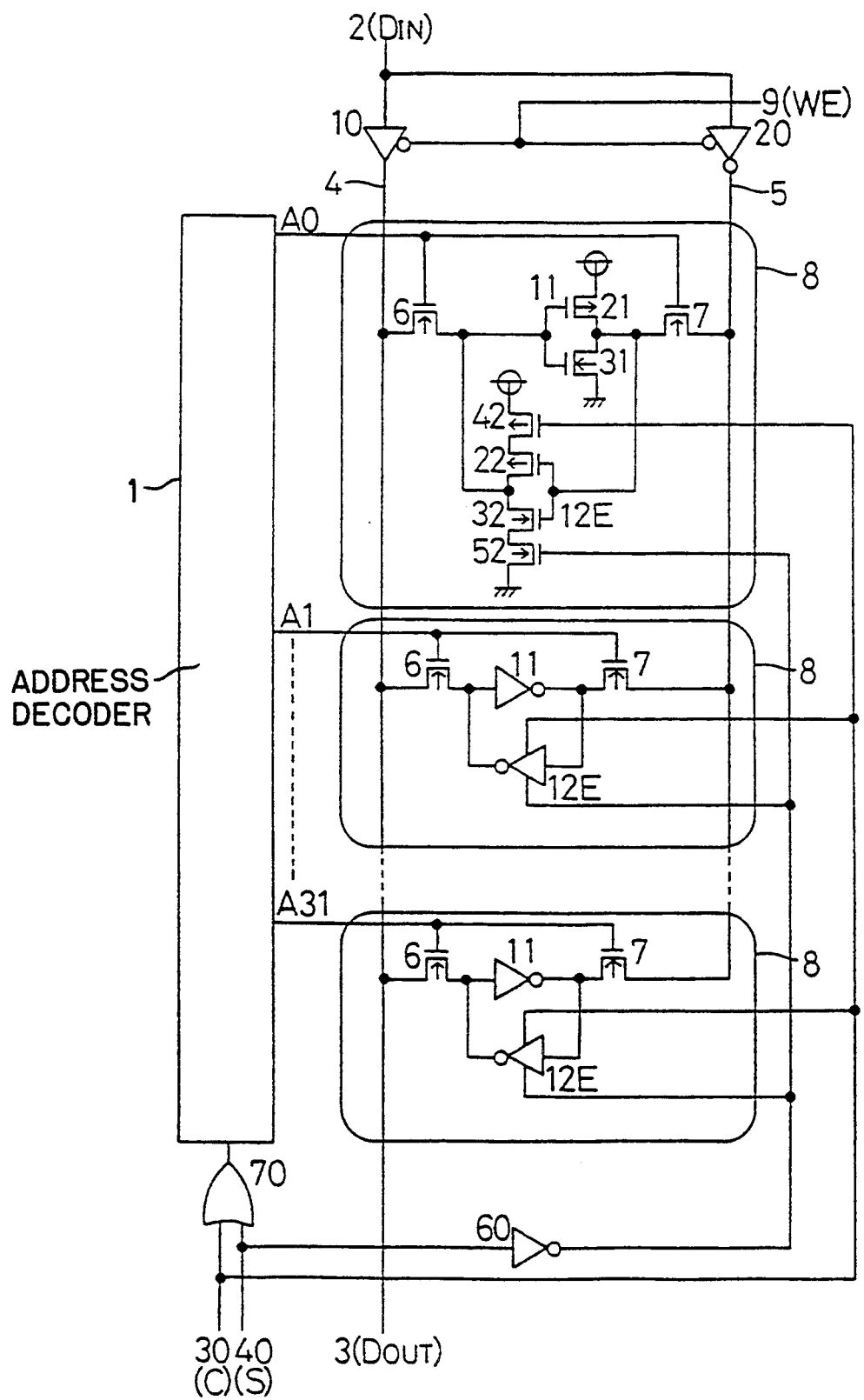
FIG. 7 is a diagram illustrating a circuit construction of a semiconductor memory device in accordance with a seventh embodiment of the present invention.

A description is given of a seventh embodiment of the present invention with reference to FIG. 7. In FIG. 7, the same reference numerals as those in FIGS. 1 to 6 designate the same or corresponding elements. A control function appended inverter 12E comprises a p channel transistor 22 and an n channel transistor 32, and an additionally connected p channel transistor 42 and n channel transistor 52. The additionally provided p channel transistor 42, having a gate input connected to a signal 30, is connected between the p channel transistor 22 of the inverter 12 of the prior art device and the power supply as a first power supply and the additionally provided n channel transistor 52, having a gate input connected to a signal which is obtained from the signal 40 inverted through the inverter 60, is connected between the n channel transistor 32 and the ground as a second power supply. Each block 8, comprising n channel transistors 6 and 7, an inverter 11, and the control function appended inverter 12E, is connected to one of address lines A0 to A31.

First, the usual writing in operation in which signals 30 and 40 are both "L" is described. As in the prior art device, when the signal WE is "L", the data input $D_{IN}$ and the inverted data $D_{IN}$ are applied to the data line 4 and the inverted data line 5, respectively. Then, one of the address lines A0 to A31, for example A0, becomes "H" in response to the address decoder 1, and the data $D_{IN}$ is written in into the selected memory element. Here, when the data $D_{IN}$ is "L", "0" is written in the memory element while when the data $D_{IN}$ is "H", "1" is written in.

Second, the operation at initializing all memory elements to "0" is described. When signals 30(C) and 40(S) are set "H" and "L", respectively, all address lines A0 to A31 are set "H", and a data input $D_{IN}$ is set "L", an "L" voltage and an "H" voltage are applied to all memory elements through the data line 4 and the inverted data line 5, respectively. At this time, since the signal 30 is set "H", the additionally connected second p channel transistor 42 is turned off to cut the "H" driving path for "H" driving the control function appended inverter 12E from the power supply through the p channel transistor 22. Therefore, the writing driver 10 easily reduces the input voltage of the inverter 11 to a value lower than the transition voltage of the inverter 11 even when the data held in this memory element before the initialization is "1", and the output voltage of the inverter 11 becomes "H", which is equal to an output voltage of the writing driver 20. In this way, "0" can be written in all memory elements, even if each every memory element contains "1" data before being initialized.

Third, the operation of initializing all memory elements to "1" is described. When signals 30(C) and 40(S) are set "L" and "H", respectively, all address lines A0 to A31 are set "H", and the data input $D_{IN}$ is set "H", an "H" voltage and an "L" voltage are applied to all memory elements through the data line 4 and the inverted data line 5, respectively. At this time, since the signal 40 is set "H", the second n channel transistor 52 is turned off to cut the "L" driving path for "L" driving the control function appended inverter 12E from the ground through the n channel transistor 32. Therefore, the writing driver 10 easily increases the input voltage of the inverter 11 to a value higher than the transition voltage of the inverter 11 even when the data held in this memory element before initialization is "0", and the output voltage of the inverter 11 becomes "L", which is equal to an output voltage of the writing driver 20. In this way, "1" can be written in all memory elements, even if each memory element contains "0" before being initialized.

In the seventh embodiment, although a p channel transistor and an n channel transistor are additionally connected to one of two inverters which are included in each memory element, the transistors may be connected to another one of the two inverters so as to obtain the effects same as those described above.

As described above, a memory element according to the present invention comprises two inverters, one of which includes, in addition to first p channel and n channel transistors, a second p channel transistor connected in series with the first p channel transistor, and even if the output voltage of a writing driver and an inverter in a memory element are different from each other at initialization, "H" or "L" driving of one of the two inverters is inhibited. This reliably enables writing of desired data into all the memory elements at the same time without malfunction. In addition, a reduction in current consumption is also accomplished.

In addition, conventionally, memory elements may often comprise two p channel transistors and four n channel transistors, and when in a memory array such as a gate array the same number of p channel transistors and n channel transistors are arranged and such memory elements are constructed in this memory array, two p channel transistors are left unused. In such circumstances, even when two p channel transistors are used as control transistors in the above embodiments, the memory area in the semiconductor chip does not increase with relative to the conventional memory devices and the present invention is especially effective in such cases.

Although the memory elements in the above-described embodiments have "32 words×1 bit" construction, the present invention is also applicable to memory elements of other constructions.

What is claimed is:

1. A semiconductor memory device comprising:
   a data line for receiving a voltage and an inverted data line having a voltage inverted relative to the voltage received by said data line; and
   a plurality of memory elements connected to said data line and said inverted data line, each memory element comprising:
   a first selection transistor having an input connected to said data line, a gate connected to an address line of an address decoder, and an output, and a second selection transistor having an input connected to said inverted data line, a gate connected to said gate of said first selection transistor, and an output, said first and second selection transistors selecting said memory element for writing in data and reading out data through said data line and said inverted data line, respectively, in response to an address signal applied to the address line by the address decoder;
   first and second inverters, each of said first and second inverters comprising a first p channel transistor having a gate and a first n channel transistor having a gate, said first p channel transistor and said first n channel transistor of each inverter being connected in series, having the respective gates connected together as an input terminal of said inverter, a junction of the series-connected first p channel transistor and first n channel transistor being an output terminal of said inverter wherein said input terminal of said first inverter and said output terminal of said second inverter are connected to said output of said first selection transistor and said output terminal of said first inverter and said input terminal of said second inverter are connected to said output of said second selection transistor; and
   a second p channel transistor connected in series with said first p channel transistor of one of said first and second inverters, said second p channel transistor having a gate connected, for receiving an initialization signal, to an initialization terminal of the address decoder.

2. A semiconductor memory device comprising:
   a data line for receiving a voltage and an inverted data line having a voltage inverted relative to the voltage received by said data line; and
   a plurality of memory elements connected to said data line and said inverted data line, each memory element comprising:
   a first selection transistor having an input connected to said data line, a gate connected to an address line of an address decoder, and an output, and a second selection transistor having an input connected to said inverted data line, a gate connected to said gate of said first selection transistor, and an output, said first and second selection transistors selecting said memory element for writing in data and reading out data through said data line and said inverted data line, respectively, in response to an address signal applied to the address line by the address decoder;
   first and second inverters, each of said first and second inverters comprising a first p channel transistor having a gate and a first n channel transistor having a gate, said first p channel transistor and said first n channel transistor of each inverter being connected in series, having the respective gates connected together as an input terminal of said inverter, a junction of the series-connected first p channel transistor and first n channel transistor being an output terminal of said inverter wherein said input terminal of said first inverter and said output terminal of said second inverter are connected to said output of said first selection transistor and said output terminal of said first inverter and said input terminal of said second inverter are connected to said output of said second selection transistor; and
   two second p channel transistors respectively connected in series with said first p channel transistors of said first and second inverters, each of said two second p channel transistors having gates connected, for receiving respective initialization signals, to an initialization terminal of the address decoder through an OR gate.

3. A semiconductor memory device comprising:
   a data line for receiving a voltage and an inverted data line having a voltage inverted relative to the voltage received by said data line;
   a plurality of memory elements connected to said data line and said inverted data line, each memory element comprising:
   a first selection transistor having an input connected to said data line, a gate connected to an address line of an address decoder, and an output, and a second selection transistor having an input connected to said inverted data line, a gate connected to said gate of said first selection transistor, and an output, said first and second selection transistors selecting said memory element for writing in data and reading out data through said data line and said inverted data line, respectively, in response to an address signal applied to the address line by the address decoder;
   first and second inverters, each of said first and second inverters comprising a first p channel transistor having a gate and a first n channel transistor having a gate, said first p channel transistor and said first n channel transistor of each inverter being connected in series, having the respective gates connected together as an input terminal of said inverter, a junction of the series-connected first p channel transistor and first n channel transistor being an output terminal of said inverter wherein said input terminal of said first inverter and said output terminal of said second inverter are connected to said output of said first selection transistor and said output terminal of said first inverter and said input terminal of said second inverter are connected to said output of said second selection transistor; and
   a second n channel transistor connected in series with said first n channel transistor of one of said first and second inverters, said second n channel transistor having a gate connected, for receiving an initialization signal through a third inverter, to an initialization terminal of the address decoder.

4. A semiconductor memory device comprising:

a data line for receiving a voltage and an inverted data line having a voltage inverted relative to the voltage received by said data line; and a plurality of memory elements connected to said data line and said inverted data line, each memory element comprising:

a first selection transistor having an input connected to said data line, a gate connected to an address line of an address decoder, and an output, and a second selection transistor having an input connected to said inverted data line, a gate connected to said gate of said first selection transistor, and an output, said first and second selection transistors selecting said memory element for writing in data and reading out data through said data line and said inverted data line, respectively, in response to an address signal applied to the address line by the address decoder;

first and second inverters, each of said first and second inverters comprising a first p channel transistor having a gate and a first n channel transistor having a gate, said first p channel transistor and said first n channel transistor of each inverter being connected in series, having the respective gates connected together as an input terminal of said inverter, a junction of the series-connected first p channel transistor and first n channel transistor being an output terminal of said inverter wherein said input terminal of said first inverter and said output terminal of said second inverter are connected to said output of said first selection transistor and said output terminal of said first inverter and said input terminal of said second inverter are connected to said output of said second selection transistor; and two second n channel transistors respectively connected in series with said first n channel transistors of said first and second inverters, each of said two second n channel transistors having gates connected, for receiving respective initialization signals through third and fourth inverters, respectively, to an initialization terminal of the address decoder through an OR gate.

5. A semiconductor memory device comprising:

a data line for receiving a voltage and an inverted data line having a voltage inverted relative to the voltage received by said data line; and a plurality of memory elements connected to said data line and said inverted data line, each memory element comprising:

a first selection transistor having an input connected to said data line, a gate connected to an address line of an address decoder, and an output, and a second selection transistor having an input connected to said inverted data line, a gate connected to said gate of said first selection transistor, and an output, said first and second selection transistors selecting said memory element for writing in data and reading out data through said data line and said inverted data line, respectively, in response to an address signal applied to the address line by the address decoder;

first and second inverters, each of said first and second inverters comprising a first p channel transistor having a gate and a first n channel transistor having a gate, said first p channel transistor and said first n channel transistor of each inverter being connected in series, having the respective gates connected together as an input terminal of said inverter, a junction of the series-connected first p channel transistor and first n channel transistor being an output terminal of said inverter wherein said input terminal of said first inverter and said output terminal of said second inverter are connected to said output of said first selection transistor and said output terminal of said first inverter and said input terminal of said second inverter are connected to said output of said second selection transistor; and a second p channel transistor and a second n channel transistor connected in series with said first p channel transistor and said first n channel transistor, respectively, of one of said first and second inverters, said second p channel transistor and said second n channel transistor having respective gates, for receiving respective first and second initialization signals, the gate of said second n channel transistor being connected for receiving the second initialization signal through a third inverter, the first and second initialization signals being connected to an initialization terminal of the address decoder through an OR gate.

* * * * *